United States Patent
Yamaguchi et al.

(10) Patent No.: US 6,818,097 B2
(45) Date of Patent: Nov. 16, 2004

(54) HIGHLY HEAT-RESISTANT PLASMA ETCHING ELECTRODE AND DRY ETCHING DEVICE INCLUDING THE SAME

(75) Inventors: Akira Yamaguchi, Saitama (JP); Hideshi Tomita, Chiba (JP)

(73) Assignee: Nisshinbo Industries, Inc., Tokyo (JP)

( * ) Notice: Subject to any disclaimer, the term of this patent is extended or adjusted under 35 U.S.C. 154(b) by 179 days.

(21) Appl. No.: 10/199,465

(22) Filed: Jul. 22, 2002

(65) Prior Publication Data

US 2003/0196759 A1 Oct. 23, 2003

(30) Foreign Application Priority Data

Apr. 22, 2002 (JP) ........................................ 2002-118861
Jun. 27, 2002 (JP) ........................................ 2002-187529

(51) Int. Cl.$^7$ ............................ H05H 1/00; C23C 16/00
(52) U.S. Cl. ............................ 156/345.47; 156/345.43; 156/345.34; 118/723 E
(58) Field of Search ........................ 156/345.34, 345.47; 118/723 E, 724, 715; 204/298.01, 298.31

(56) References Cited

U.S. PATENT DOCUMENTS

| | | | |
|---|---|---|---|
| 5,074,456 A | * | 12/1991 | Degner et al. ............... 228/121 |
| 5,951,814 A | * | 9/1999 | Saito et al. ............... 156/345.1 |
| 6,073,577 A | * | 6/2000 | Lilleland et al. ......... 118/723 E |
| 6,083,644 A | * | 7/2000 | Watanabe et al. ......... 429/231.1 |

* cited by examiner

Primary Examiner—Parviz Hassanzadeh
(74) Attorney, Agent, or Firm—Westerman, Hattori, Daniels & Adrian, LLP

(57) ABSTRACT

A plasma etching electrode for dry etching devices for production of semiconductor devices. The plasma etching electrode is prevented from contamination with impurities, provides good thermal and electrical conductance and heat resistance at the joint between the electrode plate and pedestal (or supporting ring), and hence improves etching characteristics and silicon wafer yield. The highly heat-resistant plasma etching electrode includes an electrode plate of silicon which is supported by and uniformly joined to a pedestal by an adhesive. The pedestal is made of graphite. The adhesive includes an epoxy resin containing polycarbodiimide resin and carbon powder. A dry etching device including the electrode is also described.

12 Claims, 2 Drawing Sheets

11: Etchant gas ejecting hole
8: Electrode plate of silicon
10: Joint (joint face)
9: Pedestal (ring) of graphite 11: Etchant gas ejecting hole
8: Electrode plate of silicon
10: Joint (joint face)
9: Pedestal (ring) of graphite

HIGHLY HEAT-RESISTANT PLASMA ETCHING ELECTRODE AND DRY ETCHING DEVICE INCLUDING THE SAME

BACKGROUND OF THE INVENTION

1. Field of the Invention

This invention relates to a plasma etching electrode for dry etching devices for production of semiconductor devices, and a dry etching device including the same, more particularly to a highly heat-resistant plasma etching electrode for dry etching devices with 2 or more members composed of a silicon electrode plate supported by a pedestal being joined by an epoxy-based adhesive agent, and a dry etching device including the same.

2. Description of the Prior Art

As information devices represented by computers advance, the semiconductor integrated circuit as the main component of these devices is increasingly required to have higher degree of integration. In the production of a semiconductor device, the works are conducted in a clean working atmosphere, e.g., in a clean room, for meeting the performance requirements, because each production step as well as the stock material is extremely sensitive to contamination with impurities. It is needless to say that each component for the production facility is required not to produce impurities.

The wafer treatment processes, represented by ion implantation, dry etching and sputtering, are effected in a reaction chamber, frequently referred to as a chamber, which can be evacuated to a high degree of vacuum. The wafer treatment processes are increasingly required to meet the higher purity standards, as the degree of integration increases for semiconductor integrated circuits, with the result that the chamber and each of its components are required to have the material characteristics as free as possible of contamination with impurities.

Taking dry etching as an example, the component members inside of the chamber are described by referring to FIG. 3. The chamber normally includes a pair of electrodes, i.e., upper and lower electrodes, facing each other, the lower electrode being connected to an RF power source to produce a plasma between the counter electrodes. A silicon wafer is set immediately above the lower electrode via a mounting member, to be etched with an etchant gas in a plasma atmosphere.

Some of the conventional plasma etching electrodes, including an upper electrode, for dry etching devices have complicated shapes to be set in a chamber structure. The plasma etching electrode is often composed of the components of glassy carbon, silicon or silicon carbide (SiC), and assembling these components into a monolithic structure greatly increases the cost.

Therefore, the upper electrode for a dry etching device is composed of an electrode plate of silicon or the like which is joined to a pedestal (or support ring) of metal or metal oxide by brazing with a metal, e.g., indium or silver. These metallic brazing materials cause no problem with respect to electrical and thermal conductivity.

However, joining by brazing with a metal, e.g., indium, causes problems as wafer treating temperature increases to improve the plasma etching device performance. The brazing metal, although having a high adhesive strength, may be insufficient regarding its resistance to heat. For example, the faces joined by indium may be separated from each other, when exposed to a temperature exceeding 156° C. as the melting point of indium. The joining needs pretreatment, e.g., undercoating treatment with a metallic film by sputtering, and other time-consuming works at high temperature, which tends to increase costs for workability and treatment.

Moreover, the brazing metal itself may cause contamination of the silicon wafer. Therefore, the joining method rarely has good etching characteristics for dry etching, and tends to lower the yield of the semiconductor device, or silicon wafer.

Several attempts have been made to solve these problems. For example, U.S. Pat. No. 5,074,456 proposes an upper electrode joined using a metal-filled epoxies, and U.S. Pat. No. 6,073,577 proposes an upper electrode joined using a metal particles-containing elastomeric materials.

These inventions claim that the electrode plate and pedestal can be joined to each other more precisely, because of uniformly decreased thickness of the adhesive layer to a size of the metal particles, keeping good parallelism between the upper and lower electrodes and avoiding contamination with impurities.

However, these inventions have lower thermal conductivity between the electrode plate and pedestal, in spite of the metallic filler present in the adhesive layer, than the case where they are joined by a brazing material, possibly causing a temperature distribution between the electrode plate periphery and center, and hence deteriorating the etching characteristics.

Therefore, the joined type plasma etching electrode is required to have electrical and thermal conductance and heat resistance at the joint, and a type of plasma etching electrode excellent in these characteristics has been strongly demanded.

SUMMARY OF THE INVENTION

It is an object of the present invention to provide a plasma etching electrode which does not become contaminated with impurities, has good thermal and electrical conductance and heat resistance at the joint between the electrode plate and pedestal (or supporting ring), and hence improves the etching characteristics and silicon wafer yield by solving the problems involved with conventional plasma etching electrodes for dry etching devices. It is another object to provide a dry etching device including the same.

The inventors of the present invention have found, after having extensively studied for developing the optimum plasma etching electrode for dry etching devices in order to solve the above problems, that the electrode plate and pedestal can be securely joined even at high temperatures and, at the same time, good thermal and electrical conductance can be realized between the electrode and pedestal when graphite, which does not become contaminated with impurities, is used as the material for the pedestal and joined to the electrode plate of silicon by a polycarbodiimide-containing epoxy resin-based adhesive agent incorporated with carbon as the thermal and electrical conductive filler, thereby achieving the present invention.

The first aspect of the invention provides a highly heat-resistant plasma etching electrode for dry etching devices, comprising an electrode plate of silicon supported by and securely and uniformly joined to a pedestal by an adhesive agent, wherein
(a) the pedestal is made of graphite, and
(b) an epoxy resin containing polycarbodiimide resin and carbon powder are used as the adhesive agent.

The second aspect of the invention provides a plasma etching electrode for dry etching devices which is the same as that of the first aspect, wherein the adhesive agent contains 5 to 20 parts by weight of a polycarbodiimide resin and 12 to 440 parts by weight of carbon powder per 100 parts by weight of an epoxy resin.

The third aspect of the invention provides a plasma etching electrode for dry etching devices which is the same as that of the first aspect, wherein the adhesive agent contains a curing agent or curing promoter.

The fourth aspect of the invention provides a plasma etching electrode for dry etching devices which is the same as that of the third aspect, wherein the curing agent is of a compound selected from the group consisting of an amine-, hydrazine-, phenol- and acid anhydride-based compound, and the curing promoter is of a compound selected from the group consisting of imidazole, a tertiary amine and metallic complex.

The fifth aspect of the invention provides a plasma etching electrode for dry etching devices which is the same as that of the third aspect, wherein the curing agent or curing promoter is incorporated at 1 to 150 parts by weight per 100 parts by weight of the epoxy resin.

The sixth aspect of the invention provides a plasma etching electrode for dry etching devices which is the same as that of the first aspect, wherein the polycarbodiimide resin is an aromatic-based compound.

The seventh aspect of the invention provides a plasma etching electrode for dry etching devices which is the same as that of the first aspect, wherein the epoxy resin is a bisphenol A type one.

The eighth aspect of the invention provides a plasma etching electrode for dry etching devices which is the same as that of the first aspect, wherein the carbon powder has a Young's modulus of elasticity of $6 \times 10^9$ to $68 \times 10^9 N/m^2$.

The ninth aspect of the invention provides a plasma etching electrode for dry etching devices which is the same as that of the first aspect, wherein the pedestal is coated with glass-like carbon entirely except for the joint with the electrode plate of silicon.

The tenth aspect of the invention provides a plasma etching electrode for dry etching devices which is the same as that of the ninth aspect, wherein the coating film of glass-like carbon has a thickness of 1 to 3 $\mu$m.

The eleventh aspect of the invention provides a plasma etching electrode for dry etching devices which is the same as that of the first aspect, wherein the electrode plate of silicon is made of single-crystalline silicon and has through-holes.

The twelfth aspect of the invention provides a dry etching device which includes the plasma etching electrode of one of the first to eleventh aspect.

As described above, the present invention relates to a highly heat-resistant plasma etching electrode for dry etching devices, comprising an electrode plate of silicon supported by and securely and uniformly joined to a pedestal by an adhesive agent, wherein (a) the pedestal is made of graphite, and (b) an epoxy resin containing polycarbodiimide resin and carbon powder are used for the adhesive agent. The preferred embodiments of the invention include the following:

(1) The plasma etching electrode for dry etching devices which is the same as that of the first aspect of the invention wherein the electrode serves as the upper electrode.

NOTATION

Figure 1:
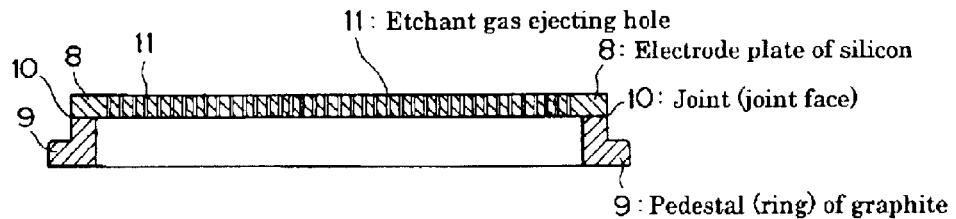
FIG. 1 schematically illustrates the plasma etching electrode (upper electrode).

1 Etchant gas inlet nozzle
2 Discharge nozzle
3 Plasma etching electrode (upper electrode)
4 Lower electrode
5 Silicon wafer
6 Plasma
7 RF power source
8 Electrode plate of silicon
9 Pedestal (ring) of graphite
10 Joint (joint face)
11 Etchant gas ejecting hole

DETAILED DESCRIPTION OF THE INVENTION

The present invention is described in detail for each item:
1. Plasma Etching Electrode The plasma etching electrode of the present invention is highly resistant to heat, comprising an electrode plate of silicon supported by and securely and uniformly joined to a pedestal by an adhesive agent, wherein
(a) the pedestal is made of graphite, and
(b) an epoxy resin containing polycarbodiimide resin and carbon powder are used for the adhesive agent.

A plasma etching electrode (i.e., upper electrode) is normally divided into at least 2 members, one actually facing the wafer and responsible for distributing the gases, and the other being fixed to the device. The member facing the wafer and responsible for distributing the gases is the electrode plate, often of silicon. The member fixed to the device (i.e., pedestal) may be of any material so long as it is highly conductive both electrically and thermally, and is made of a metal, carbon, ceramic or the like.

The electrode plate, pedestal and joint are described as follows:
(1) Electrode Plate An electrode plate of silicon is an appropriate choice for the plasma etching electrode of the present invention. It is in the form of a disk having a number of holes on a plate surface, through which an etchant gas is ejected. The etchant gas is converted into plasma while passing through the holes in the upper electrode, and a silicon wafer set on a lower electrode is etched with the reactive ions it attracts from the plasma.

Silicon serving as the base for the electrode plate is not limited, but preferably single-crystalline, highly pure and dense silicon is used. One of the examples of such silicon is P-type single-crystal silicon doped with boron (B), having the crystal orientation of <100>. Its resistivity is normally in a range from 1 $\mu\Omega\cdot$cm to 30 $\Omega\cdot$cm.

(2) Pedestal

The plasma etching electrode of the present invention includes a pedestal (or support ring) normally of graphite which comes into contact with the back side of the electrode plate of silicon. The pedestal of graphite causes the heat generated at the upper electrode to dissipate (the thermal conducting effect), while preventing contamination with impurities in the silicon wafer during the etching process.

The pedestal of graphite, also serving as the cooling ring, is preferably highly heat conducting (having a high heat conductivity) and has a small difference in thermal expansion coefficient with that of the electrode plate of silicon. Otherwise, there would be a temperature gradient between the disk center and periphery of the electrode, which can be one of the causes of uneven etching characteristics. A pedestal of low heat conductivity and having a large difference in thermal expansion coefficient from that of the electrode plate may not well cope with certain requirements, e.g., for increasing silicon wafer size, increasing treatment temperature, or adoption of rapid heating/cooling cycles.

Graphite serving as the base for the pedestal is not required to be highly pure, but is preferably highly pure to cause no contamination with impurities during the silicon wafer etching process, and to have a high thermal conductivity and a small difference in thermal expansion coefficient with that of the electrode plate of silicon. One of the examples of such graphite is the semiconductor-grade one, and the commercial products include CX-2123, CX-2114, CX-2206 and E+25 (LE-CARBONE), and EGF-262 and EGF-264 (Nippon Carbon).

The pedestal of graphite may be of a composite of graphite and glass-like carbon.

It is preferable that the graphite surface be coated with glass-like carbon, at least for the portion exposed to the etchant gas during the dry etching process, i.e., the portion other than that joined to the electrode plate of silicon. These portions include the side and back of the pedestal.

The graphite surface is coated with glass like carbon normally to a thickness of 1 to 3 $\mu$m. The coating method is not limited, and may be selected from conventional ones. In particular, the preferable ones include coating the graphite with a certain type of resin, e.g., polycarbodiimide or phenolic resin by spraying or impregnation, and firing the resin into the glass-like carbon.

When the impregnation treatment is adopted, the glass-like carbon may be formed also from the pedestal surface on the inside, and the thickness of the whole glass-like carbon layer can be increased to 3 $\mu$m or more.

The glass-like carbon layer works as a protective layer for the graphite, controlling formation of dust from the graphite and making it more resistant to corrosion. In particular, it controls the release of gas from the graphite in the plasma atmosphere during the dry etching process, and prevents contamination of the wafer with, e.g., particles of the substances that constitute the oxide layer, separated from the graphite surface and deposited on the wafer.

Glass-like carbon is also referred to as non-graphitizable carbon or hard carbon. It is not limited with respect to the stock or production method, so long as it is produced by solid-phase carbonization of an organic substance. The stocks for glass-like carbon include cellulose, thermosetting resins, e.g., furfuryl alcohol, and thermoplastic resins. Various methods have been proposed to produce glass-like carbon from these stock materials.

(3) Joint Face (Joint Layer)

The above-described two or more members are joined to each other with the aid of a specific epoxy-based adhesive agent, described below. The joint layer should be electroconductive, because the assembly is set in the device in which a plasma is generated. The joint should also be thermally conductive to improve the heat exchanging efficiency at the portion fixed to the device, which is cooled to cool the wafer face directly exposed to the plasma.

The joint should be also sufficiently resistant to heat, because it may be exposed to a temperature up to 200° C. on the side exposed to the gas.

2. Adhesive Agent

As described above, the joint layer at which two or more members are joined to each other is required to be electrically and thermally conductive and resistant to heat. Therefore, the adhesive agent for joining members for the present invention contains an epoxy resin and a carbon powder, the former containing a polycarbodiimide resin.

A silicone-based adhesive agent may be chosen as heat-resistant to join members at low cost. However, its thermal expansion coefficient is $10^{-4}$/° C., which differs from that of silicon and graphite ($10^{-6}$/° C.) as the materials for the members to be joined by 2 orders of magnitude at a high temperature atmosphere, with the result that they may be separated from each other. Therefore, it is not an option for the present invention. An epoxy-based adhesive agent has a thermal expansion coefficient of the order of $10^{-5}$/° C., reducing the possibility of member separation, because of the smaller difference in thermal expansion coefficient.

(1) Polycarbodiimide Resin

The polycarbodiimide resin useful for the present invention may be produced by various methods. Basically, the polycarbodiimide with isocyanate at the terminal, produced by conventional methods of producing polycarbodiimide resin (refer to U.S. Pat. No. 2,941,956 and Japanese Patent Publication No. 47-33279) can be used. More specifically, it is produced by condensation involving removal of carbon dioxide (i.e., decarboxylation condensation) from an organic polyisocyanate.

The organic polyisocyanates as the stocks for synthesizing the polycarbodiimide include aromatic polyisocyanate, aliphatic polyisocyanate, alicyclic polyisocyanate and a mixture thereof. More specifically, they include 1,5-naphthalene diisocyanate, 4,4'-diphenylmethane diisocyanate, 4,4'-diphenyldimethylmethane diisocyanate, 1,3-phenylene diisocyanate, 1,4-phenylene diisocyanate, 2,4-tolylene diisocyanate, 2,6-tolylene diisocyanate, a mixture of 2,4-tolylene diisocyanate and 2,6-tolylene diisocyanate, hexamethylene diisocyanate, cyclohexane-1, 4-diisocyanate, xylylene diisocyanate, isophorone diisocyanate, dicyclohexylmethane-4,4'-diisocyanate, methylcyclohexane diisocyanate, tetramethylxylylene diisocyanate, 2,6-diisopropylphenyl diisocyanate and 1,3,5-triisopropylbenzene-2,4-diisocyanate.

Of the polycarbodiimide resins, the one produced from at least one type of aromatic polyisocyanate is preferable for the present invention, wherein the aromatic polyisocyanate is the isocyanate having at least 2 isocyanate groups directly bonded in the aromatic ring in the molecule.

The carbodiimide resins useful for the present invention include the aromatic-, aliphatic- and alicyclic-based compounds, of which the aromatic-based ones are particularly preferable for their resistance to heat.

The organic diisocyanates useful for the present invention also include the ones whose polymerization degree is adequately controlled using a compound, e.g., monoisocyanate, which is reactive with the terminal isocyanate group of the carbodiimide compound.

The monoisocyanates which can seal the terminal of polycarbodiimide to control its polymerization degree include phenyl isocyanate, tolyl isocyanate, dimethylphenyl isocyanate, cyclohexyl isocyanate, butyl isocyanate and naphthyl isocyanate.

The other compounds reactive with the terminal isocyanate group to serve as the sealant include the following aliphatic, aromatic and alicyclic compounds: (i) those having —OH group, e.g., methanol, ethanol, phenol, cyclohexanol, N-methyletahnolamine, polyethylene glycol monomethyl ether and polypropylene glycol monomethyl ether; (ii) diethyl amine and dicyclohexyl amine having =NH group; (iii) butyl amine and cyclohexyl amine having —NH$_2$ group; (iv) propionic, benzoic and cyclohexane carboxylic acid having —COOH group; (v) ethyl mercaptan, allyl mercapatan and thiophenol having —SH group; and (vi) compounds having epoxy group.

The decarboxylation/condensation reaction of the organic diisocyanate proceeds in the presence of catalyst for producing carbodiimide. Such catalysts include phospholene oxides, e.g., 1-phenyl-2-phospholene-1-oxide, 3-methyl-1-phenyl-2-phospholene-1-oxide, 1-ethyl-2-phospholene-1-oxide, 3-methyl-2-phospholene-1-oxide, and a 3-phospholene isomer thereof. Of these, 3-methyl-1-phenyl-2-phospholene-1-oxide is more preferable for its reactivity.

The polycarbodiimide resin for the present invention preferably has a number-average molecular weight of 3,000 to 50,000 as polystyrene, determined by gel permeation chromatography (GPC), more preferably 10,000 to 30,000, and still more preferably 15,000 to 25,000, whether it is incorporated with the terminal sealant or not. It is sufficiently resistant to heat when it has a number-average molecular weight of 3,000 or more. The one having a molecular weight above 50,000 is not practical, because it needs a long reaction time for synthesis.

(2) Epoxy Resin

The epoxy resin for the adhesive agent for the present invention may be selected from those generally known for epoxy resin-based adhesive agents. These epoxy resins include those having 2 or more epoxy groups in the molecule, such as glycidyl ether type epoxy resins, e.g., bisphenol A, bisphenol F, phenol novolac and cresol novolac type epoxy resin; and alicyclic, glycidyl ester type, glycidyl amine type, heterocyclic and liquid-rubber-modified type epoxy resin. They may be used either individually or in combination. Of these, bisphenol A, bisphenol F, phenol novolac and cresol novolac type epoxy resin are more preferable, and bisphenol A type is still more preferable. The epoxy resin useful for the present invention is not limited to the above, but is preferably hardened more quickly in the presence of the above-described polycarbodiimide resin.

(3) Carbon Powder

Carbon powder as the adhesive agent for the present invention works as the thermally or electrically conductive filler which provides or improves thermal or electrical conductance of the adhesive agent, when incorporated therein by kneading.

The known electroconductive fillers include those of metals, e.g., silver and copper, carbon powder, and fine, silver-plated powder. In this invention, carbon (or graphite) powder is used for its thermal stability and the ability to adjust the modulus of elasticity.

The effect of carbon powder on adhesive agent conductance varies depending on its shape, particle size and content in the agent. It has a particle size of 1 to 100 μm, preferably 10 to 50 μm, and preferably has a relatively narrow particle size distribution.

Moreover, it preferably has a Young's modulus of elasticity of $6 \times 10^9$ to $68 \times 10^9 N/m^2$.

(4) Adhesive Agent Composition

The adhesive agent for the present invention can be prepared by mixing an epoxy resin containing at least a polycarbodiimide resin with carbon powder.

The adhesive agent composition for the present invention normally contains a polycarbodiimide resin preferably at 5 to 20 parts by/weight per 100 parts by weight of the epoxy resin, viewed from the adhesive force of the agent. At below 5 parts by weight, the agent may not join the members sufficiently fast. At above 20 parts by weight, on the other hand, its effect may not be fully exhibited. For example, the adhesive agent free of polycarbodiimide resin generally has a shear strength of around 15 MPa (around 150 kg/cm$^2$), determined by the shear strength test (JIS K6850), after it is cured. The shear strength gradually increases as polycarbodiimide resin content increases, attaining a maximum of 20 MPa or more at the content of around 5 to 20 parts by weight.

The carbon powder is incorporated at 10 to 90 parts by weight per 100 parts by weight of the whole adhesive agent composition, i.e., 10 to 90% by weight, preferably 30 to 80 parts by weight (i.e., 30 to 80% by weight) with respect to the electrical resistance of the electrode itself. In other words, it is incorporated at 11 to 400 parts by weight per 100 parts by weight of the epoxy resin containing a polycarbodiimide resin (polycarbodiimide resin +epoxy resin), or 12 to 440 parts by weight per 100 parts by weight of the epoxy resin, preferably 47 to 440 parts by weight with respect to the electrical resistance of the electrode itself.

The method of mixing is not limited; for example, the components may be mixed by melt kneading using a kneader or a hot roll mixer, or in the presence of an adequate solvent inert to the polycarbodiimide and epoxy resin.

The adhesive agent for the present invention may be incorporated with one or more additives or fillers selected from those conventionally used for adhesive compositions within limits not harmful to the goals of the present invention. The preferable additives and fillers for the present invention include fibrous reinforcing agents, powdery or crystalline fillers (e.g., molten silica), pigments, and curing agents and curing promoters which accelerate curing by the reactions between the polycarbodiimide and epoxy resin. The curing agent or promoter, when used, is incorporated at 1 to 150 parts by weight per 100 parts by weight of the epoxy resin, and its content can be adjusted depending on type of the epoxy resin and curing conditions.

The curing agents useful for the present invention include amine-based compounds, e.g., dicyandiamide, hydrazine-based compounds, phenolic compounds and acid anhydrides. The curing promoters include imidazole, tertiary amine and metal complex, which itself bound to the adhesive agent while promoting the reactions between the epoxy resin and curing agent.

These additives may be added during or after the above-described mixing step, or incorporated beforehand in one of the resins before the mixing step.

The adhesive agent for the present invention can be transformed into the final, cured product, when heated normally at 80 to 200° C., preferably at 120 to 200° C.

It is considered that the adhesive agent is cured by crosslinking caused by the reactions between the carbodiimide group in the polycarbodiimide resin and epoxy group.

EXAMPLES

The present invention is described in more detail by EXAMPLES using drawings and COMPARATIVE EXAMPLE, which by no means limit the present invention.

Examples 1 to 6

Outline of the plasma etching electrode and member-joining method

Figure 2:
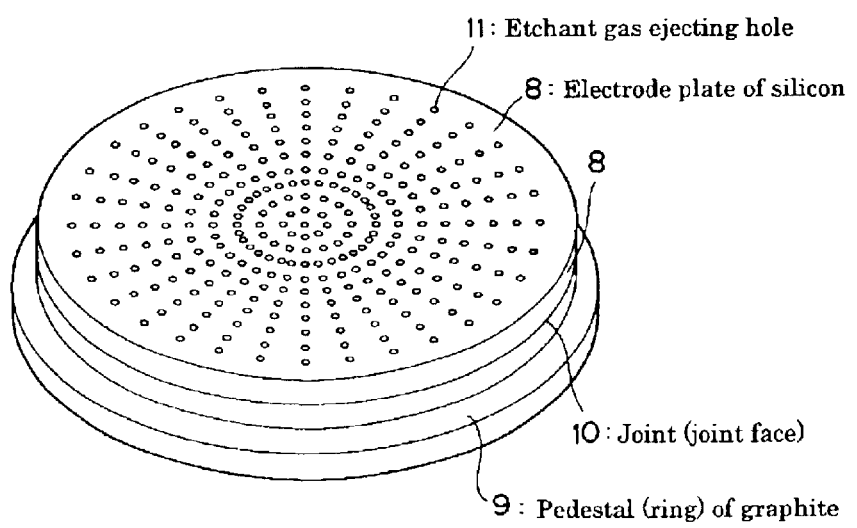
FIG. 2 presents the oblique view of the plasma etching electrode (upper electrode).
Figure 3:
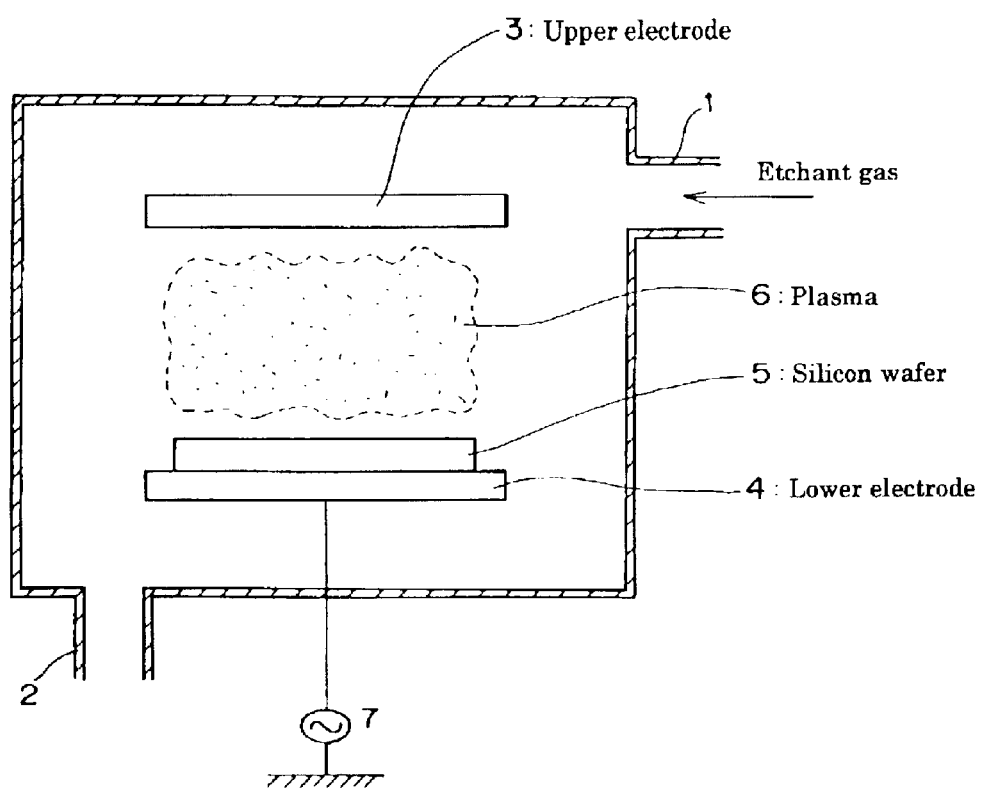
FIG. 3 schematically illustrates the dry etching device.

The plasma etching electrode, i.e., the upper electrode, of the present invention is one component of a dry etching device for production of silicon wafers. The etching device is outlined in FIG. 3, and the upper electrode is outlined in FIGS. 1 and 2.

The electrode plate 8 of silicon was of P-type (doped with B) single-crystal silicon (Si) having crystal orientation of <100> and an electrical resistivity of 15 $\Omega \cdot cm$, formed into the shape having dimensions of 223.5 mm in diameter and 6.35 mm in thickness, and provided with 3200 etchant gas ejecting holes (diameter: 0.8 mm).

The graphite ring (pedestal) 9 was of graphite (LE-CARBONE's E+25), formed into the shape having dimensions of 223.5 mm in diameter and 19 mm in thickness, and provided with a collar by which the ring was fixed to the device.

The electrode plate 8 of silicon was joined to the graphite ring 9 via the joint 10, to form the plasma etching electrodes 1 to 6, where the joint 10 was comprised an adhesive agent prepared by kneading 10 parts by weight of an aromatic-based polycarbodiimide resin (Nisshinbo Industries' Carbodilite 10M-SP™), 10 parts by weight of dicyandiamide as the curing agent and 2 parts by weight of imidazole as the curing promoter per 100 parts by weight of a bisphenol A type epoxy resin, and also 12, 47, 73, 110, 257 or 440 parts by weight of graphite powder (Kawasaki Steel's HA2500F) per 100 parts by weight of the epoxy resin.

The plasma etching electrode thus prepared was used as the component for a dry etching device for production of silicon wafers.

The plasma etching electrode was set in the dry etching device (LAM RESEARCH's Exel 4250) was evaluated for overall electrical resistance, etching rate and resistance of the joint to heat (measured by presence or absence of the separation after it was exposed to 6,000 cycles of wafer etching at 2,000W for 5 minutes and cooling for 2 minutes). The overall electrical resistance was determined by an analyzer (Mitsubishi Chemical's MCP-T600). The evaluation results are given in Table 1.

TABLE 1

| Electrodes | Graphite powder content (parts by weight per 100 parts by weight of the epoxy resin) | Overall electrical resistance $\Omega$ | Etching rate (Å) | Resistance to heat |
| --- | --- | --- | --- | --- |
| EXAMPLE 1 | 12 | $2.2 \times 10^6$ | 5980 | No separation observed |
| EXAMPLE 2 | 47 | $4.8 \times 10^5$ | 6050 | No separation observed |
| EXAMPLE 3 | 73 | $9.2 \times 10^6$ | 6220 | No separation observed |
| EXAMPLE 4 | 110 | $2.3 \times 10^2$ | 6290 | No separation observed |
| EXAMPLE 5 | 257 | $9.3 \times 10^2$ | 6310 | No separation observed |
| EXAMPLE 6 | 440 | $1.2 \times 10^2$ | 6320 | No separation observed |

Comparative Examples 1 to 3

The same electrode plate 8 of silicon and graphite ring 9 as those for EXAMPLES 1 to 6 were joined to each other via the joint 10 formed by brazing with indium (In) (COMPARATIVE EXAMPLE 1), an adhesive agent composed of a silicone-based adhesive agent kneaded with the same quantity of carbon (graphite) powder (COMPARATIVE EXAMPLE 2), and epoxy-based adhesive agent composed of 100 parts by weight of an epoxy resin kneaded with 10 parts by weight of dicyandiamine as the curing agent and 110 parts by weight of carbon (graphite) powder (COMPARATIVE EXAMPLE 3). They were evaluated in the same manner as in EXAMPLES 1 to 6. The results are given in Table 2

TABLE 2

| Electrodes | Joint | Overall electrical resistance ($\Omega$) | Etching rate (Å) | Resistance to heat |
| --- | --- | --- | --- | --- |
| COMPARATIVE EXAMPLE 1 | In | $1.2 \times 10$ | 6340 | Separated at the $8^{th}$ etching cycle |
| COMPARATIVE EXAMPLE 2 | Silicone-based adhesive, composed of 100 parts by weight of a silicone-based adhesive agent and 100 parts by weight of graphite powder | $4.5 \times 10^3$ | 6270 | Separated at the $2,000^{th}$ etching cycle |
| COMPARATIVE EXAMPLE 3 | Epoxy-based adhesive, composed of 100 parts by weight of an epoxy resin, 10 parts by weight of a curing agent and 110 parts by weight of graphite powder | $3.6 \times 10^3$ | 6250 | Separated at the $50^{th}$ etching cycle |

As shown in Tables 1 and 2, the joint 10 of the electrode prepared in each of EXAMPLES 1 to 6 was sufficiently resistant to heat not to be separated during the testing period. By contrast, the joint 10 of the electrode prepared in each of COMPARATIVE EXAMPLES 1 to 3 was less resistant to heat and separated during the testing period.

Therefore, the plasma etching electrode of the present invention is excellent for improving the chip production yield.

It is accepted that the preferable etching rate standard is in a range of 6300±300 Å, and the electrodes prepared in EXAMPLES 2 to 6 meet that standard. The carbodiimide-containing epoxy-based adhesive agent containing the graphite powder at above 440 parts by weight was spread on the joint 10 with difficulty due to increased viscosity, and it is considered that it would have an etching rate almost the same as that observed in EXAMPLE 6. It is therefore found that the optimum graphite content is in a range of 47 to 440 parts by weight per 100 parts by weight of the epoxy resin with respect to etching rate.

The plasma etching electrode of the present invention is highly resistant to heat, comprising an electrode plate of silicon supported by and securely and uniformly joined to a pedestal by an adhesive agent, wherein (a) the pedestal is made of graphite, and (b) an epoxy resin containing polycarbodiimide resin and carbon powder are used for the adhesive agent.

This structure allows the electrode to work at a high temperature at which the electrode prepared with the aid of the conventional adhesive agent is unserviceable, and this structure improves electrical and thermal conductance of the electrode. It also produces the favorable effect of having good etching characteristics without causing contamination with impurities, thereby improving semiconductor device production yield. Moreover, the electrode plate can be joined to the pedestal at room temperature without needing the undercoating treatment or the like, and hence at a lower cost.

What is claimed is:

1. A highly heat-resistant plasma etching electrode for dry etching devices, comprising:
   an electrode plate of silicon;
   a pedestal to which said electrode plate is securely and uniformly joined with an adhesive agent, wherein (a) the pedestal is made of graphite, and (b) an epoxy resin containing polycarbodiimide resin and carbon powder are used for the adhesive agent.

2. The plasma etching electrode for dry etching devices according to claim 1, wherein said adhesive agent contains 5 to 20 parts by weight of a polycarbodiimide resin and 12 to 440 parts by weight of carbon powder per 100 parts by weight of an epoxy resin.

3. The plasma etching electrode for dry etching devices according to claim 1, wherein said adhesive agent contains a curing agent or curing promoter.

4. The plasma etching electrode for dry etching devices according to claim 3, wherein said curing agent is of a compound selected from the group consisting of an amine-, hydrazine-, phenol- and acid anhydride-based compound, and the curing promoter is of a compound selected from the group consisting of imidazole, a tertiary amine and metallic complex.

5. The plasma etching electrode for dry etching devices according to claim 3, wherein said curing agent or curing promoter is incorporated at 1 to 150 parts by weight per 100 parts by weight of the epoxy resin.

6. The plasma etching electrode for dry etching devices according to claim 1, wherein said polycarbodiimide resin is an aromatic-based compound.

7. The plasma etching electrode for dry etching devices according to claim 1, wherein said epoxy resin is a bisphenol A type one.

8. The plasma etching electrode for dry etching devices according to claim 1, wherein said carbon powder has a Young's modulus of elasticity of $6 \times 10^9$ to $68 \times 10^9 N/m^2$.

9. The plasma etching electrode for dry etching devices according to claim 1, wherein said pedestal is coated with glass-like carbon entirely except for the joint with the electrode plate of silicon.

10. The plasma etching electrode for dry etching devices according to claim 9, wherein said coating film of glass-like carbon has a thickness of 1 to 3 µm.

11. The plasma etching electrode for dry etching devices according to claim 1, wherein said electrode plate of silicon is made of single-crystalline silicon and has through-holes.

12. A dry etching device which includes the plasma etching electrode of one of claims 1 to 11.

* * * * *